United States Patent [19]
Chinn et al.

[11] Patent Number: 5,943,386
[45] Date of Patent: Aug. 24, 1999

[54] HIGH-SPEED SYNCHRONOUS COUNTER CIRCUITRY

[75] Inventors: Gregson D. Chinn, Oro Valley, Ariz.; Dwight N. Oda, Rancho Santa Margarita, Calif.

[73] Assignee: Hughes Electronics, Los Angeles, Calif.

[21] Appl. No.: 08/449,461

[22] Filed: May 24, 1995

[51] Int. Cl.[6] .................................................. H03K 21/16
[52] U.S. Cl. .............................................................. 377/116
[58] Field of Search ............................................. 377/116

[56] References Cited

U.S. PATENT DOCUMENTS 5,060,243  10/1991  Eckert ........................................ 377/116

*Primary Examiner*—Margaret Rose Wambach
*Attorney, Agent, or Firm*—Michael W. Sales; Wanda K. Denson-Low

[57] ABSTRACT

Digital counter register stages are constructed as two-to-one mux registers, each employing a multiplexer stage having first, second, and third inputs and an output connected to the switching signal input of a D-type flip-flop, whose Q output comprises a first input to the multiplexer stage. An inverter buffer is associated with each register stage and has an input connected to the output of said D-type flip-flop and an output connected to the second input of the multiplexer stage and fed forward to a NOR gate associated with each subsequent register stage. The output of the NOR gate comprises the third input to the multiplexer stage of the associated register stage.

14 Claims, 4 Drawing Sheets

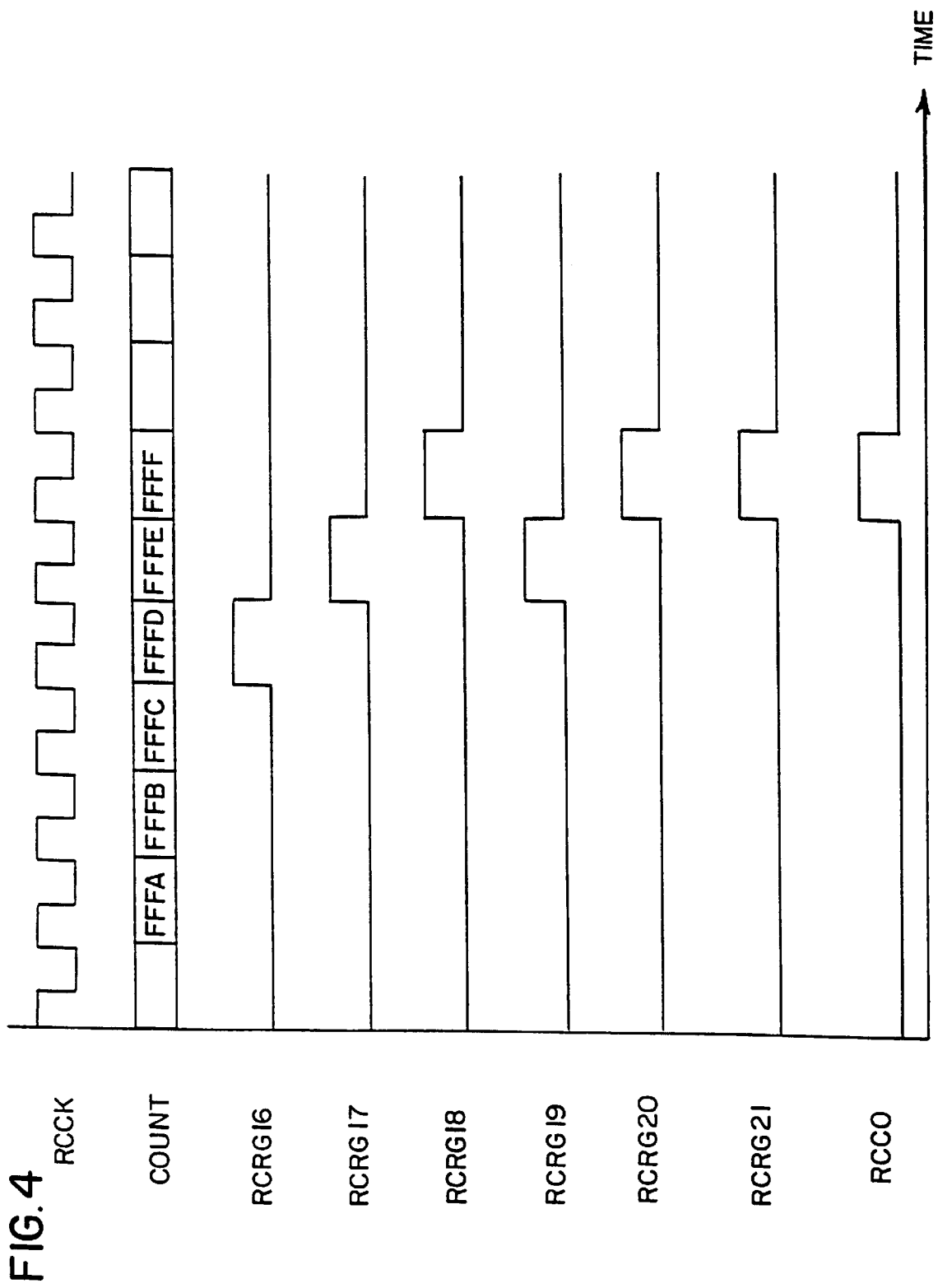

HIGH-SPEED SYNCHRONOUS COUNTER CIRCUITRY

BACKGROUND OF THE INVENTION

1. Field of the Invention

The subject invention relates to digital circuitry and, more particularly, to a low-cost 16-bit synchronous counter implemented in GaAs technology that achieves speeds in excess of 600 Mhz over the military temperature range of −55 to 125° C.

2. Description of Related Art

Conventional synchronous counters are comprised of a series of registers configured through the interconnection of AND gates, EX-OR gates, and D-type flip-flops. In operation, each of the registers contains a binary digit, which together represent the number of pulses counted. The speed at which the counters can perform is determined, in large part, by the speed at which the components of the counters can react. Typical delays encountered include gate delays (the time it takes an electronic gate to react), flip-flop delays (the time it takes a flip-flop to change to the desired output), interconnect delays (the time it takes the signal to travel between components), and setup delays (the time an input signal to a flip-flop must be held while waiting for the clock pulse). Each of the delays encountered in producing a carry signal reduces the speed performance of the counter.

In general, a carry signal is generated when the count contained in a particular group of registers has reached the limit of that group of registers (e.g., each digit is a one so the registers are "full"). The carry signal generated indicates to the next group of registers that one count is to be added. At the next clock pulse, one count is added to the contents of the next group of registers and the first group of registers is reset to zero.

Where the carry signal is not generated until the group of registers is full, the speed of the counter is constrained by the time it takes for the counter to execute the carry and reset the appropriate registers before it can resume counting. Therefore, to the extent that the carry signal can be generated before it is needed, and be applied at precisely the time required, this delay is avoided and the speed performance of the counter can be improved. Look-ahead carry circuitry for reducing delays and, hence, increasing counter speed is also known in the art, as disclosed in U.S. Pat. No. 5,062,126 assigned to the present assignee.

Gallium arsenide is a known device technology for producing high-speed operation. However, application of conventional counter design to gallium arsenide technology, even employing look-ahead carry, cannot achieve counting speeds which approach 600 MHz over a range of −55 to 125° C. Such counter speeds appear desirable to advance the state of the art in various apparatus such as laser range finder systems requiring better than one meter resolution.

OBJECTS AND SUMMARY OF THE INVENTION

Accordingly, it is an object of the invention to improve digital counter design;

It is another object of the invention to provide binary digital counter circuitry capable of achieving speeds in excess of 600 MHz; and It is another object of the invention to provide such counter circuitry for achieving such rates in a 16-bit counter design.

According to the invention, counter circuitry is provided which minimizes delays associated with gate propagation and AC loading due to line lengths. Each bit of the counter is registered using a two-to-one mux register, which reduces gate delays. The outputs of these registers switch simultaneously, which allows the counter register contents to be stable long enough such that the present count value may be accessed in real time.

According to a further aspect of the invention, the foregoing novel counter circuitry is employed to implement a 16-bit counter separated into four 4-bit counter sections. En order to combine all four sections together, registered look-ahead carry circuits are implemented. That is, carry signals are produced in anticipation of when they are required, thereby eliminating much of the counter's inherent delays. In an illustrative embodiment, the least significant four-bit section utilizes a look-ahead-by-three, followed by the next section with a look-ahead-by-two, and the third with a look-ahead-by-one.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 4 is a timing diagram useful in illustrating look-ahead carry operation according to the preferred embodiment.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide a 16-bit counter readily applicable to achieve 600 mHz operation over military temperature ranges and particularly useful in laser range finder applications.

Figure 1:
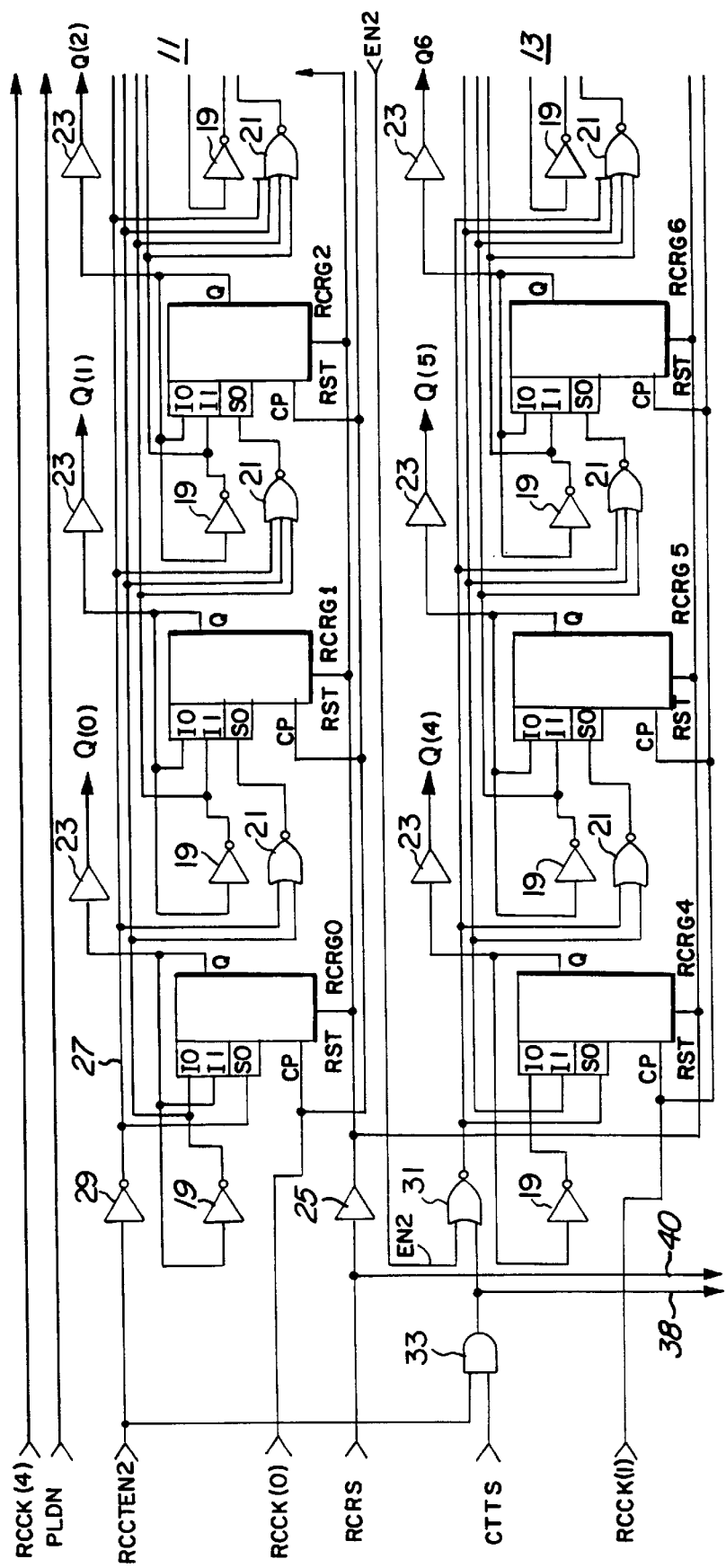
FIG. 1 is a circuit diagram of counter circuitry according to the preferred embodiment.

FIG. 1 illustrates counter circuitry according to the preferred embodiment. The circuitry preferably includes 16 register stages RCRG(0), RCRG(1), RCRG(3) . . . RCRG (15), which are preferably organized into four 4-bit sections 11, 13, 15, 17 to form a 16-bit counter, as will be more readily appreciated upon consideration of FIGS. 1 and 2 in combination. The counter circuitry of FIGS. 1 and 2 further employs a number of inverters 19, a number of NOR gates 21, and a number of noninverting buffers 23, each buffer 23 outputting a respective count bit Q(0), Q(1) . . . Q(15).

Figure 2:
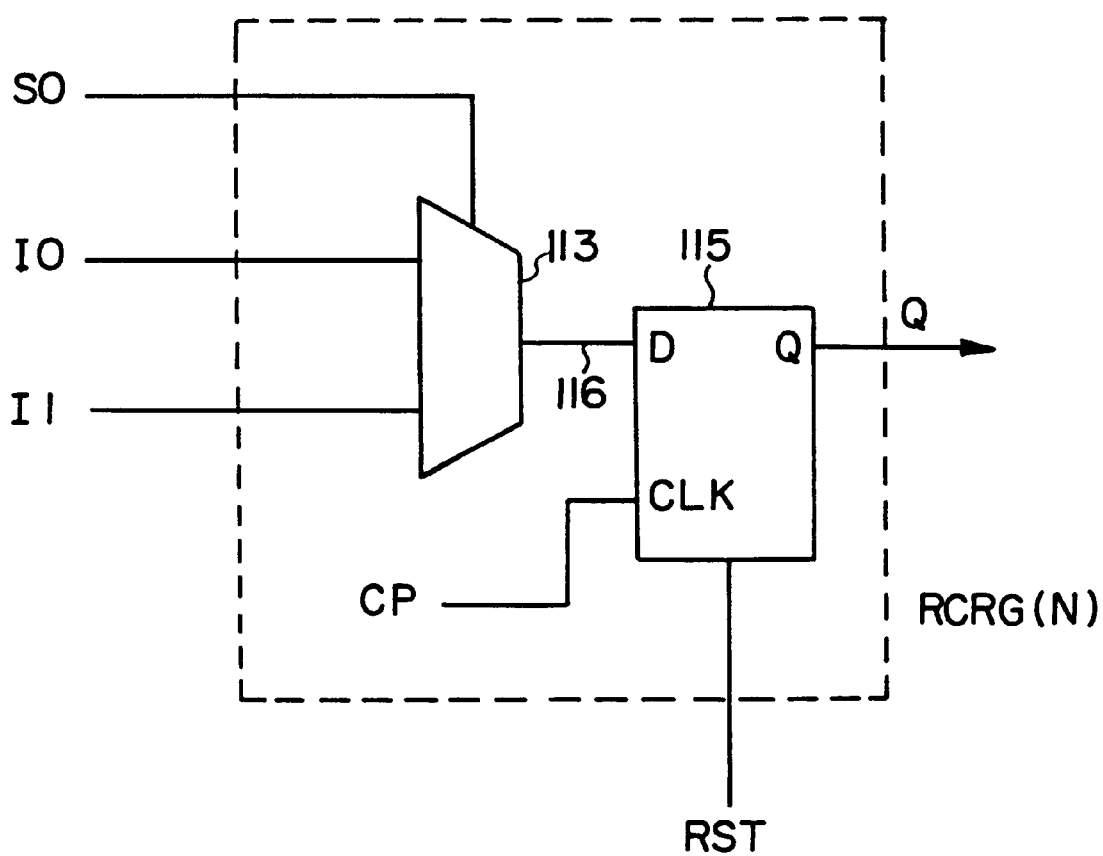
FIG. 2 is a circuit diagram illustrating mux register circuitry employed according to the preferred embodiment.

As shown in FIG. 2, each register stage RCRG(N) is a two-to-one mux register or logic module, including a mux stage 13 and a D-type flip-flop 115. The mux stage 113 receives a select signal S0, as well as inputs "I1" and "I0", and has its output 16 connected to the "D" input of the flip-flop 15. The flip-flop 15 further receives a clock input, such as a 600-mHz clock signal on lead CP, and a reset signal on a line RST, and outputs its present contents on its Q output. The mux stage 113 functions such that if S0 is logic "1," I1 is present on line 16 on the next clock pulse, and if S0 is logic zero, I0 is present on line 16 on the next clock pulse.

As further shown in FIG. 1, the "CP" input of each stage RCRG(N) is connected to a clock RCCK. Each RST input of each stage RCRG(N) is connected through a buffer 25 to a common reset signal RCRS. A count enable signal RCCTEN2 is provided to the first four-bit section on a line 27 after being inverted by an inverting buffer 29. The count enable signal RCCTEN2 is particularly useful in range counter applications to start the counter operation upon firing of a laser pulse.

Considering the first register stage RCRG(0) (count bit 1), its Q output is fed directly back to its I1 input and through a first of the inverter-buffers 19 to its I0 input. The Q output of the first register stage RCRG(0) is also provided as an output bit Q(0) through a buffer 23. The S0 input of the first register stage RCRG(0) is connected to the count enable signal provided on line 27.

The output $\overline{Q}$ of the first inverter buffer 19 is fed forward as one input to a first of the NOR gates 21. This first NOR gate 21 forms part of the next stage of the counter circuitry, which contains count bit 2 and provides output bit Q(1). The second counter stage differs from the first in that the first NOR gate 21 receives the count enable signal on line 27 as its second input and provides its output to the S0 input of the second register stage RCRG(1) based on the inverted value of Q from the first register stage RCRG(0), i.e. $\overline{Q}$. Each NOR gate 21 associated with each subsequent register stage, e.g. RCRG(2), receives each of the $\overline{Q}$ outputs of each of the previous register stages, e.g. RCRG(0) and RCRG(1).

The second four-bit section 13 of the counter circuitry of FIG. 1 generally replicates the first four-bit section 11, with the exception that the enable signal applied to the S0 inputs of each of the register stages RCRG(5)-RCRG(7) is supplied by the output of a NOR gate 31, which receives a signal EN2 and the output of an AND gate 33 as its inputs. The signal EN2 is the output of the look-ahead carry stage 35 (FIG. 3) of the first four-bit counter section 11. The output of the AND gate 33 is developed by AND-ing the enable signal RCCTEN2 and a signal CTTS (counter test select), which is a zero in normal operation. When CTTS is "1," it causes all counter stages to count together up to F (hex) for testing purposes.

Each subsequent four-bit section 15, 17 of the counter circuitry similarly replicates the second section 13 and has respective NOR gates, e.g. 31, receiving the respective outputs EN3, EN4 (FIG. 2) of the previous section's look-ahead carry stages 37, 39. Each such NOR gate further receives the output of the AND gate 33 as its respective second input, via line 38 (FIG. 1). Line 40 (FIG. 1) provides the reset signal RST to the register stages of subsequent four-bit sections 15, 17.

Figure 3:
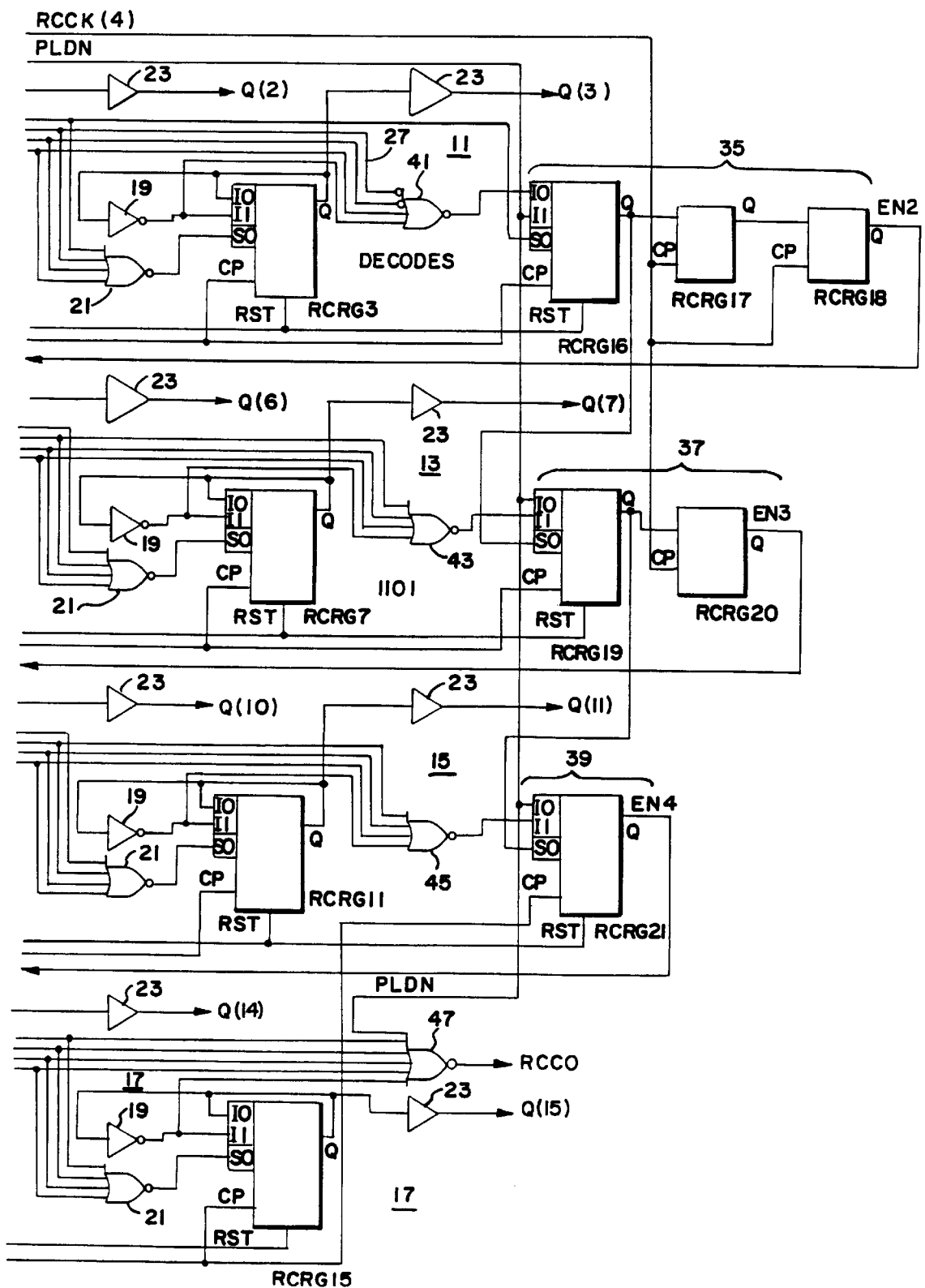
FIG. 3 is a circuit diagram of counter circuitry according to the preferred embodiment, particularly illustrating the preferred look-ahead carry structure.

As may be seen in FIG. 3, the first look-ahead carry stage 35 looks ahead by three and comprises three one-bit register stages RCRG(16), RCRG(17), and RCRB(18) and a first four-input NOR gate 41 having two inverting inputs. The second look-ahead carry stage 37, which looks ahead by two, comprises two one-bit register stages RCRG(19) and RCRG(20) and a second four-input NOR gate 43 and outputs an enable signal EN3. The last look-ahead carry stage 39 includes a single one-bit register stage RCRG(21) and a third four-input NOR gate 45 and outputs an enable signal EN4.

The first four-input NOR gate 41 receives as its inputs the inverted form of the enable signal on line 27, the inverted form $\overline{Q}$ of the output signal of the first register stage RCRG(0), and the respective $\overline{Q}$ signals from the inverters 19 of the register stages RCRG(1) and RCRG(2). The second four-input NOR gate 43 receives as its inputs the respective $\overline{Q}$ signals from the inverters 19 of the previous four register stages RCRG(4)-RCRG(7) of the second four-bit section 13. The third four-input NOR gate 45 receives as its inputs the respective $\overline{Q}$ signals from the inverters 19 of the four previous register stages RCRG(8)-RCRG(11) of the third four-bit section 15. A fourth five-input NOR gate 47 generates the 16-bit terminal carry-out signal RCC0. This fourth NOR gate 47 receives as its inputs, the output of the NOR gate 31 (not shown) of the fourth counter section 17, the $\overline{Q}$ signals output by the inverters 19 from the four previous register stages RCRG(12)-RCRG(15) and the PLDN signal. The PLDN signal is always a logic zero.

In operation, the counter of the preferred embodiment is cleared to 0's via the asynchronous reset signal (RCRS). The counter will remain idle until the count enable signal (RCCTEN2) becomes active. The mux register RCRG(0) for bit 1 will then select its S0 input, which causes the count to increment from 0 to 1 on the next rising edge of the clock signal (RCCK). Each successive rising clock edge will toggle bit 1 (1,0,1,0, etc.). When bit 1 is a "1," the mux register RCRG(1) for bit 2 will select its S0 input, which will toggle its Q output. In order for the output of the next mux register, e.g. RCRG(3) to toggle, all of the previous stages, e.g. RCRG(1), RCRG(2) must be high. This counting sequence is identical for each four-bit section 11, 13, 15, 17.

Each four-bit section 11, 13, 15 is responsible for enabling the following four-bit section 13, 15, 17 to count using a look-ahead carry technique. This is best illustrated when the counter approaches the count of FFFFH (hex), as illustrated in FIG. 4. FIG. 4 shows the Q outputs of the register stages RCRG(16)-RCRG(20) with respect to the clock RCCK and the hexadecimal value of the counter contents labeled "COUNT." When the counter is at FFFCH (three counts before terminal count), the look-ahead register RCRG(16) will generate an enable (select mux channel S1) for register RCRG(19) on the next clock cycle, followed by an enable for register RCRG(21). By the time the counter reaches terminal count (FFFFH), the enable signals for each four-bit stage 13, 15, 17 are already present at the outputs of registers RCRG(18), RCkG(20), and RCRG(21), as well as RCC0, the 16-bit terminal carry-out signal. All 16 bits are then able to rollover to 0000H on the next clock.

Delays are minimized according to the preferred embodiment by use of the two-to-one mux register structures of FIG. 2, wherein all register delay is within the register module RCRG(N). In this manner, gate delays associated with conventional counter structures are eliminated. Each register RCRG(N) has only a single clock edge delay. Delay is further minimized by using the buffered outputs provided by the inverters 19 to feed the NOR logic gates 21 of subsequent stages. This prevents the Q outputs of the register stages RCRG(N) from being excessively loaded (AC loading), which would result in further delay. Thus, the counter of the preferred embodiment is synchronous, i.e., the contents of each register stage RCRG(N) can toggle on the same clock edge. In a preferred embodiment employing gallium arsenide device technology, counter speeds up to 600 mHz over military temperature range and at speeds up to 1.1 gHz at room temperature may be achieved.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A high speed digital counter stage comprising:

flip-flop means having an input for providing an output count bit;

a mux stage means having an output connected to the input of said flip-flop means and responsive to a plurality of input signals for toggling the value of said count bit between "0" and "1"; and an inverter stage means for receiving said output count bit, inverting the value thereof to generate an inverted count bit, and for supplying said inverted count bit to said mux stage means as one of said plurality of input signals.

2. The register stage structure of claim 1 wherein said output count bit comprises a first or second of said plurality of input signals.

3. A digital counter register stage structure comprising:

a D-type flip-flop having a switching signal input, a clock signal input, a reset signal input and an output;

a multiplexer stage having first, second, and third inputs and an output connected to said switching signal input; and an inverter buffer having an input and an output, the input of said inverter buffer being connected to the output of said D-type flip-flop, the output of said inverter buffer being connected to said first input of said multiplexer stage.

4. The structure of claim 3, wherein the output of said D-type flip-flop is connected to said second input of said multiplexer stage.

5. The structure of claim 3, wherein said third input of said multiplexer stage comprises a select signal.

6. A digital counter comprising:

a plurality of sections, each including a plurality of register stage comprising:

flip-flop means having an input for providing an output count bit;

a mux stage means having an output connected to said input and responsive to a plurality of input signals for toggling the value of said count bit between "0" and "1"; and an inverter stage means for receiving said output count bit, inverting the value thereof to generate an inverted count bit, and for supplying said inverted count bit to said mux stage means as one of said plurality of input signals.

7. The digital counter of claim 6, wherein said output count bit comprises a first or second of said plurality of input signals.

8. The digital counter of claim 7 further including circuit means receiving said inverted count bit as an input for generating a third of said plurality of input signals.

9. The digital counter of claim 8 wherein said means for generating comprises a NOR logic gate.

10. A digital counter comprising:

a plurality of sections, each including a plurality of register stages, each register stage comprising:

flip-flop means having an input for providing an output count bit; and a mux stage means having an output connected to said input and responsive to a plurality of input signals for toggling the value of said count bit between "0" and "1".

11. The digital counter of claim 8 wherein each section but the last includes look-ahead carry means for generating a carry signal to the next section prior to the clock pulse on which said carry signal is required.

12. The digital counter of claim 11 wherein the number of sections is four and the number of register stages in each section is four, whereby said counter comprises a 16-bit counter.

13. The digital counter of claim 10 wherein the number of sections is four and the number of register stages in each section is four, whereby said counter comprises a 16-bit counter and wherein the look-ahead carry means:

(a) for the first section comprises three one-bit register stages;

(b) for the second section comprises two one-bit register stages; and (c) for the third section comprises one one-bit register stage.

14. The digital counter of claim 13 wherein said one-bit register stages each comprise a flip-flop having an input and a multiplexer having at least two inputs and an output connected to the input of said flip-flop.

* * * * *